(12) United States Patent
Wang et al.

(10) Patent No.: US 9,627,723 B2
(45) Date of Patent: Apr. 18, 2017

(54) OPERATION OF ELECTROCHEMICAL ENERGY SYSTEMS

(71) Applicant: EC Power, LLC, State College, PA (US)

(72) Inventors: Chao-Yang Wang, State College, PA (US); Puneet K. Sinha, State College, PA (US); Yan Ji, State College, PA (US); Shanhai Ge, State College, PA (US)

(73) Assignee: EC Power, LLC, State College, PA (US)

( * ) Notice: Subject to any disclaimer, the term of this patent is extended or adjusted under 35 U.S.C. 154(b) by 247 days.

(21) Appl. No.: 14/447,005

(22) Filed: Jul. 30, 2014

(65) Prior Publication Data

US 2016/0036100 A1    Feb. 4, 2016

(51) Int. Cl.
| | |
|---|---|
| *H01M 10/00* | (2006.01) |
| *H02J 7/00* | (2006.01) |
| *H01M 10/615* | (2014.01) |
| *H01M 10/0525* | (2010.01) |
| *H01M 10/637* | (2014.01) |
| *H01M 10/625* | (2014.01) |
| *H01M 10/48* | (2006.01) |
| *H01M 10/6571* | (2014.01) |
| *G01R 31/36* | (2006.01) |

(52) U.S. Cl.
CPC ...... *H01M 10/615* (2015.04); *G01R 31/3606* (2013.01); *H01M 10/0525* (2013.01); *H01M 10/486* (2013.01); *H01M 10/625* (2015.04); *H01M 10/637* (2015.04); *H01M 10/6571* (2015.04); *H02J 7/0052* (2013.01); *H02J 7/0091* (2013.01); *H01M 2220/20* (2013.01); *Y02E 60/122* (2013.01); *Y02T 10/7011* (2013.01)

(58) Field of Classification Search
None
See application file for complete search history.

(56) References Cited

U.S. PATENT DOCUMENTS

| | | | |
|---|---|---|---|
| 3,982,163 A * | 9/1976 | Hill ..................... | H01H 47/26 307/10.1 |
| 5,576,612 A | 11/1996 | Garrett et al. | |
| 6,252,379 B1 * | 6/2001 | Fischl ..................... | H02H 7/18 320/134 |

(Continued)

FOREIGN PATENT DOCUMENTS

| | | |
|---|---|---|
| JP | 2002-369402 A | 12/2002 |
| JP | 2009-118729 A | 5/2009 |

(Continued)

OTHER PUBLICATIONS

International Search Report and Written Opinion issued in International Patent Application No. PCT/US2014/059729, mailed on Jun. 29, 2015; 12 pages.

(Continued)

*Primary Examiner* — Leigh Garbowski
(74) *Attorney, Agent, or Firm* — McDermott Will & Emery LLP

(57) ABSTRACT

Electrochemical cells that include resistor switch assemblies that can operate according to temperature and batteries and power systems including such cells are disclosed.

20 Claims, 8 Drawing Sheets

100

(56) References Cited

U.S. PATENT DOCUMENTS

| | | | |
|---|---|---|---|
| 6,518,731 B2* | 2/2003 | Thomas | H02H 9/042 320/135 |
| 7,952,330 B2* | 5/2011 | Mori | H01M 2/34 320/144 |
| 8,305,725 B2* | 11/2012 | Ooi | H01M 2/1066 361/103 |
| 2006/0275653 A1 | 12/2006 | Chang et al. | |
| 2008/0100310 A1 | 5/2008 | Song et al. | |
| 2008/0252257 A1 | 10/2008 | Sufrin-Disler et al. | |
| 2010/0173179 A1 | 7/2010 | Matthias | |
| 2011/0003182 A1* | 1/2011 | Zhu | H01M 10/617 429/50 |
| 2011/0181424 A1 | 7/2011 | Hu et al. | |
| 2012/0032642 A1 | 2/2012 | Xu et al. | |
| 2012/0094150 A1 | 4/2012 | Troutman | |
| 2012/0319658 A1* | 12/2012 | White | H02J 7/0016 320/134 |
| 2013/0288089 A1 | 10/2013 | Kinoshita et al. | |
| 2015/0155602 A1* | 6/2015 | Hwang | H01M 10/425 429/50 |

FOREIGN PATENT DOCUMENTS

| | | |
|---|---|---|
| JP | 2010-205710 A | 9/2010 |
| JP | 2012-069280 A | 4/2012 |
| JP | 2012-69280 A | 4/2014 |
| JP | 2012-69496 A | 4/2014 |

OTHER PUBLICATIONS

International Search Report and Written Opinion issued in International Patent Application No. PCT/US2014/059726, mailed on Jun. 26, 2015; 13 pages.

International Search Report and Written Opinion issued in International Application No. PCT/US2015/041925 dated Oct. 29, 2015, 17 pages.

International Search Report issued in International Application No. PCT/US2014/037209 dated Sep. 9, 2014.

Ji, Y. et al., "Heating strategies for Li-ion batteries operated from subzero temperatures", Electrochimica Acta (2013) 107:664-674.

A. Pesaran et al., "Cooling and Preheating of Batteries in Hybrid Electric Vehicles ", The 6th ASME-JSME Thermal Engineering Joint Conference, Mar. 16-20, 1-7, (2003).

C.-K. Hunag et al., "The Limits of Low-Temperature Performance of Li-Ion Cells", Journal of the Electrochemical Society, 147 (8) 2893-2896 (2000).

G. Nagasubramanian, "Electrical characteristics of 18650 Li-ion cells at low temperatures", Journal of Applied Electrochemistry 31: 99-104, (2001).

H.-p. Lin et al., "Low-Temperature Behavior of Li-Ion Cells", Electrochemical and Solid-State Letters, 4 (6), A71-A73, (2001).

J. Fan et al., "Studies on Charging Lithium-Ion Cells at Low Temperatures", Journal of the Electrochemical Society, 153 (6) A1081-A1092 (2006).

M.C. Smart et al., "Use of Organic Esters as Cosolvents in Electrolytes for Lithium-Ion Batteries with Improved Low Temperature Performance", Journal of The Electrochemical Society, 149 (4) A361-A370, (2002).

M.C. Smart et al., "Electrolytes for Low-Temperature Lithium Batteries Based on Ternary Mixtures of Aliphatic Carbonates", Journal of The Electrochemical Society, 146 (2) 486-492 (1999).

M.D. Zolot et al., "Thermal Evaluation of the Honda Insight Battery Pack", 36th Intersociety Energy Conversion Engineering Conference (IECEC.01), 1-7, (2001).

S.S. Zhang et al., "Low temperature performance of graphite electrode in Li-ion cells", Electrochimica Acta (48) 241-246, (2002).

S.S. Zhang et al., "Electrochemical impedance study on the low temperature of Li-ion batteries", Electrochimica Acta (49) 1057-1061, (2004).

S.S. Zhang et al., "The low temperature performance of Li-ion batteries", Journal of Power Sources (115) 137-140 (2003).

Entire file history of U.S. Appl. No. 14/267,648.
Entire file history of U.S. Appl. No. 14/255,780.
Entire file history of U.S. Appl. No. 14/810,396.
Entire file history of U.S. Appl. No. 15/028,696.
Entire file history of U.S. Appl. No. 15/288,580.
Entire file history of U.S. Appl. No. 14,952,689.

* cited by examiner

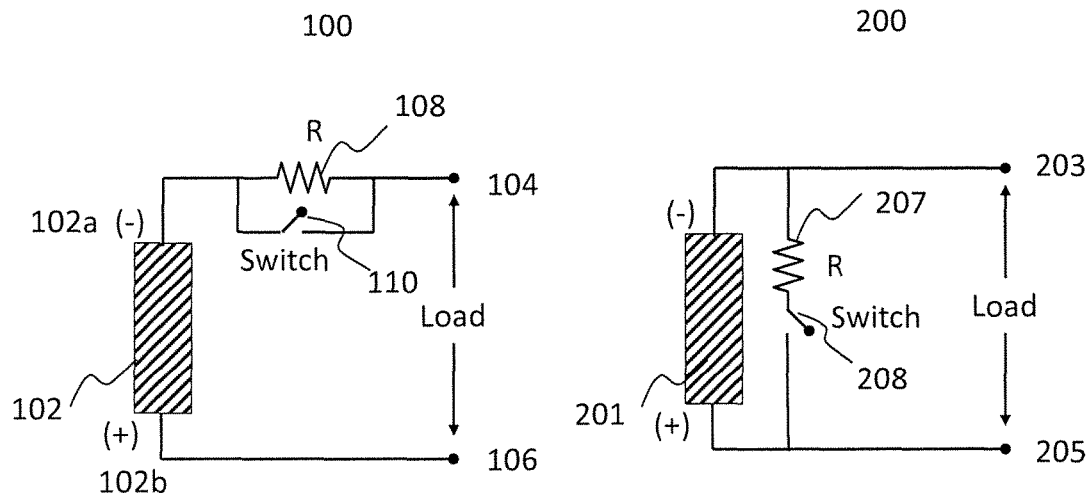
Fig. 1
Fig. 2
Prior Art
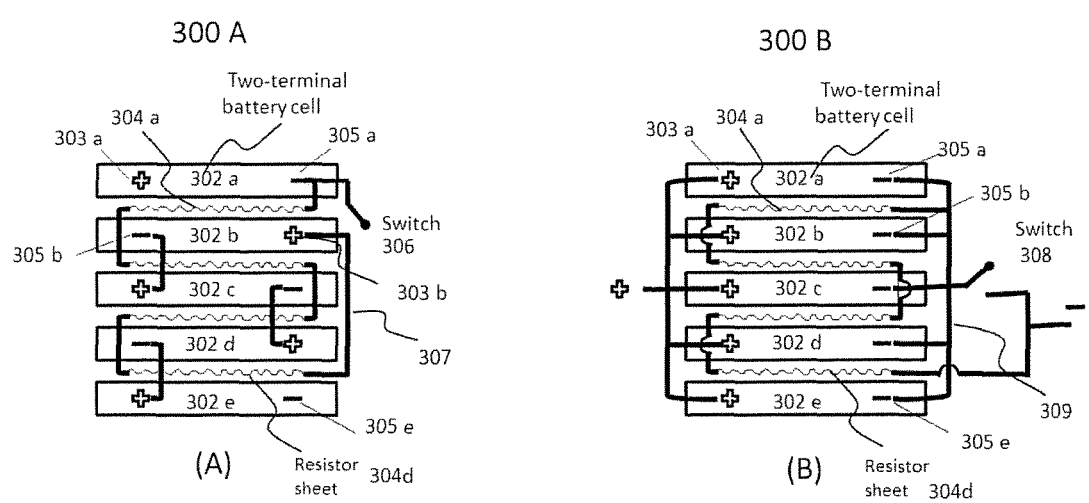
Fig. 3A
Fig. 3B

OPERATION OF ELECTROCHEMICAL ENERGY SYSTEMS

TECHNICAL FIELD

The present disclosure relates to design and operation of electrochemical energy systems and in particular to the design and operation of rechargeable electrochemical storage cells that include resistors and switches for use in rechargeable batteries and in energy systems.

BACKGROUND

Electric drive vehicles are a promising technology for reducing both greenhouse gas emissions and dependence on fossil fuels. The market share for plug-in hybrid electric vehicles (PHEV) and pure electric vehicles (EVs) has increased significantly in recent years. Despite offering the advantages of energy efficiency and low environmental impact, market penetration of EVs has been limited because of their relatively short driving range. Compared to gasoline powered vehicles which typically have a driving range of over 300 mile before refueling, current generation EVs can achieve only 100 to 200 miles before recharging. Furthermore, the driving range for EVs is greatly reduced in cold environments.

At subzero temperatures, the driving range of an EV is further adversely affected due to the poor discharge and regen power of the battery. The poor performance of Li-ion batteries in EVs, for example, is closely related to significantly reduced energy and power capabilities of such batteries, as well as capacity fade due to lithium plating upon charging. See G. Nagasubramanian, J Appl Electrochem, 31 (2001) 99-104; S. S. Zhang, K. Xu, T. R. Jow, Electrochim Acta, 49 (2004) 1057-1061; H.P. Lin, D. Chua, M. Salomon, H. C. Shiao, M. Hendrickson, E. Plichta, S. Slane, Electrochem Solid St, 4 (2001) A71-A73; J. Fan, S. Tan, J Electrochem Soc, 153 (2006) A1081-A1092.

Fundamentally, the poor performance of Li-ion batteries at subzero temperatures arises from sluggish kinetics of charge transfer, low electrolyte conductivity and reduced solid-state Li diffusivity. See C. K. Huang, J. S. Sakamoto, J. Wolfenstine, S. Surampudi, J Electrochem Soc, 147 (2000) 2893-2896; S. S. Zhang, K. Xu, T. R. Jow, J Power Sources, 115 (2003) 137-140; M. C. Smart, B. V. Ratnakumar, S. Surampudi, J Electrochem Soc, 146 (1999) 486-492; M. C. Smart, B. V. Ratnakumar, S. Surampudi, J Electrochem Soc, 149 (2002) A361-A370; S. S. Zhang, K. Xu, T. R. Jow, Electrochim Acta, 48 (2002) 241-246. While these limitations might be alleviated by finding more suitable electrolyte and active materials, an alternative approach is to devise a system to quickly pre-heating the battery to normal operation temperature before use. Since the kinetic and transport processes are highly temperature dependent, cell performance will quickly recover during warm up. See M. D. Zolot, et al., Thermal Evaluation of The Honda Insight Battery Pack, in 36th Intersociety Energy Conversion Engineering Conference, Savannah, Ga., 2001, pp. 923; A. Pesaran, et al., Cooling and Preheating of Batteries in Hybrid Electric Vehicles, in The 6th ASME-JSME Thermal Engineering Joint Conference, Hawaii Island, Hi., 2003.

Various attempts to heat batteries in electric or hybrid electric vehicles have been disclosed. U.S. Pat. No. 6,072, 301 discloses a resonant self-heating battery electric circuit to heat a battery prior to use. The electrical circuit requires the use of storage circuit for storing energy. U.S. Pat. No. 6,441,588 relates to a battery charging method that includes pulse charging and discharging operations to heat a battery prior to charging the battery. The pulse charging and discharging operations are applied to the battery as a whole by a charger that is external to the battery. U.S. Patent Publication No. 2009/0087723 A1 discloses use of a heater built in the battery that is electrically insulated from electrode terminals.

However, a continuing need exists to ameliorate the reduced performance of rechargeable batteries subject to cold temperatures.

SUMMARY OF THE DISCLOSURE

Advantages of the present disclosure include the design and operation of electrochemical energy systems and in particular to the design and operation of rechargeable electrochemical storage cells in battery systems. The electrochemical cells of the present disclosure are advantageously engineered to operate at different internal resistance levels based on a temperature of one or more cells. Such systems can be included in an electrically powered vehicle, e.g., an electric vehicle (EV), hybrid electric vehicle (HEV), and plug-in hybrid electric vehicle (PHEV), for example.

These and other advantages are satisfied, at least in part, by a circuit for operating an electrochemical cell including at least one electrochemical cell having a positive terminal and negative terminal for electrically connecting the electrochemical cell to an external load; a resistor electrically connected in series to either the positive or negative terminal of the electrochemical cell; and a temperature controlled switch electrically connected to the cell and electrically connected in parallel to the resistor, wherein the switch can direct current through the resistor (High Resistance State) or can direct current to bypass the resistor (Low Resistance State). The electrochemical cell can be a rechargeable battery unit cell or a fuel cell unit cell, for example. The resistor can be configured to increase the temperature of the electrochemical cell. Advantageously, the circuit can be included in a rechargeable battery system such as in an electrically powered vehicle.

Another aspect of the present disclosure includes rechargeable battery systems. Such systems include, for example, a plurality of electrochemical storage cells adjacent each other and electrically connected to each other; a plurality of resistor sheets electrically connected to each other, wherein each of the plurality of resistor sheets is sandwiched between adjacent cells in the plurality of electrochemical storage cells; and at least a first switch electrically connected to the plurality of electrochemical storage cells and electrically connected to the plurality of resistor sheets; wherein the switch can form a low resistance circuit by electrically connecting the plurality of electrochemical storage cells in one state (Low Resistance State) and the switch can form a high resistance circuit by electrically connecting the plurality of electrochemical storage cells through the plurality of resistor sheets in another state (High Resistance State).

In an embodiment of the present disclosure, the plurality of electrochemical storage cells each have a positive and negative terminal and the plurality of resistor sheets are electrically connected in series and have a first end and a second end wherein the first end of the plurality of resistor sheets is electrically connected to either a positive or negative terminal of one electrochemical storage cell of the plurality of electrochemical storage cells and the second end of the plurality of resistor sheets is electrically connected to the switch.

Additional embodiments of the rechargeable battery systems include, alone or in combination, wherein the plurality of electrochemical storage cells are electrically connected to each other in series and/or in parallel or a combination thereof; wherein the second end of the plurality of resistor sheets is further electrically connected to another terminal of another electrochemical storage cell of the plurality of electrochemical storage cells. The systems can further include, alone or in any combination, one or more temperature sensors for determining a temperature of one or more electrochemical storage cells in the plurality of electrochemical storage cells; one or more controllers electrically connected to one or more switches and programmed to operate the switch in the High Resistance State or Low Resistance State based on a temperature of at least one electrochemical storage cell; one or more electric motors electrically connected to the plurality of electrochemical storage cells via the one or more switches; one or more inverters to convert DC power from the plurality of electrochemical storage cells into AC power for the one or more electric motors; one or more DC-DC converters electrically connected to the plurality of electrochemical storage cells to adjust a terminal voltage of the plurality of electrochemical storage cells; one or more power management devices programmed to divert some fraction or complete load from the plurality of electrochemical storage cells between an auxiliary load and a main load depending on whether the switch in the High Resistance State or the Low Resistance State; one or more additional energy sources electrically connected to the auxiliary load; one or more active thermal management device with inert gas or liquid as a coolant to maintain a temperature of the plurality of electrochemical storage cells, for example. Advantageously, the battery systems of the present disclosure can be included in an electrically powered vehicle.

Another aspect of the present disclosure includes methods for operating the rechargeable battery systems. Such methods include, for example, determining a temperature of at least one electrochemical storage cell ($T_{bat}$); and operating the switch in either the High Resistance State or the Low Resistance State based on $T_{bat}$. For example, the switch can be operated in the High Resistance State if $T_{bat}$ is 5° C. or lower during discharge of the plurality of electrochemical storage cells or in the Low Resistance State if $T_{bat}$ is above 5° C. during discharge of the plurality of electrochemical storage cells. The method can further include operating the switch in the High Resistance State if $T_{bat}$ is 10° C. or lower during charge of the plurality of electrochemical storage cells or operating the switch in the Low Resistance State if $T_{bat}$ is above 10° C. during charge of the plurality of electrochemical storage cells.

Additional embodiments of operating the rechargeable battery systems include, alone or in combination, determining a state of charge (SOC) of the plurality of electrochemical storage cells prior to determining $T_{bat}$; discharging the plurality of electrochemical storage cells and maintaining a terminal voltage in the range of about of 0.2 to about 1.5 V per cell when the switch is in the High Resistance State; charging the plurality of electrochemical storage cells with a maximum terminal voltage per cell in the range of about 5V to about 10V when the switch is in the High Resistance State; operating a subgroup of cells in either the High Resistance State or the Low Resistance State by a cascade activation mechanism, for example.

Additional advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent similar elements throughout and wherein:

FIG. 1 is a schematic illustration of an electric circuit for an electrochemical cell according to an embodiment of the present disclosure.

FIG. 2 is a schematic illustration of an electric circuit for heating a battery.

FIGS. 3A and 3B schematically illustrate battery configurations as one of the embodiments of the present disclosure.

DETAILED DESCRIPTION OF THE DISCLOSURE

Figure 4:
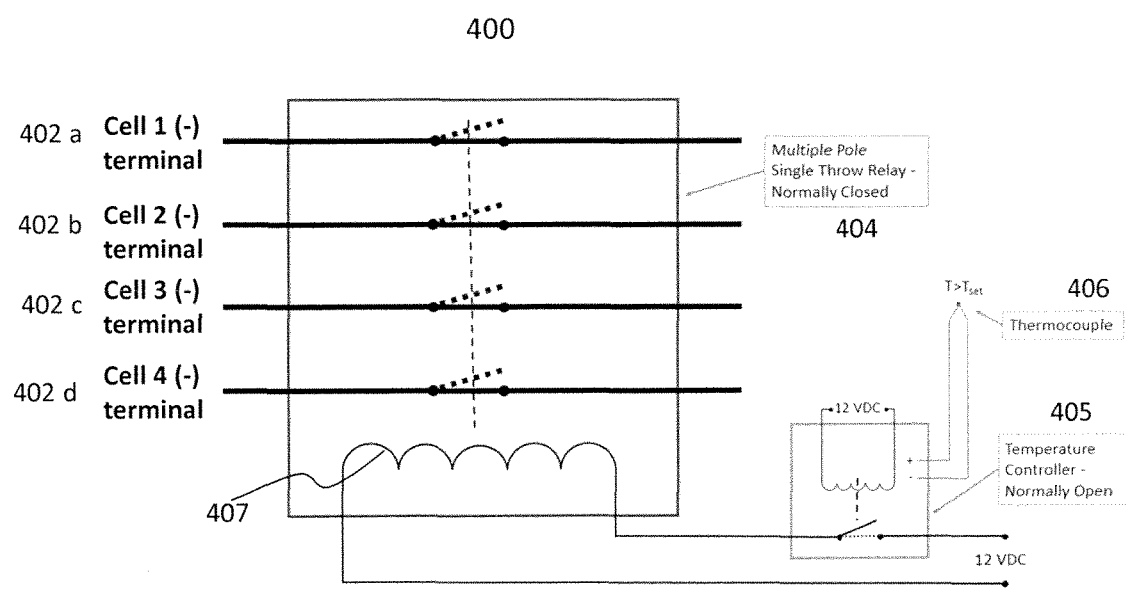
FIG. 4 is a schematic illustration of a multi-pole, single-throw switch according to an embodiment of the present disclosure.

The present disclosure relates to electrochemical cells that include more than one internal resistance states that can operate according to temperature and energy systems including such cells. An electrochemical cell as used herein refers to a device that converts chemical energy directly into electrical energy. Electrochemical cells include electrochemical storage cells, which contain active materials to function, and electrochemical fuel cells, which are supplied active materials from an external source to function. The major components of an electrochemical cell include an anode, a cathode, an electrolyte and terminals. Multiple cells can be electrically connected in an appropriate series or parallel arrangement to provide an operating voltage and current to an external load.

A battery, e.g., a rechargeable battery, includes one or more electrochemical storage cells. For example a rechargeable lithium-ion battery, lithium-polymer, lithium-sulfur, lithium-air, nickel-metal hydride battery, lead-acid battery, intermediate temperature sodium batteries, solid state battery includes at least one electrochemical storage cell as a unit cell. The battery configuration of the present disclosure can be applied to a variety of rechargeable batteries. Such batteries are useful for transportation, aerospace, military, and stationary energy storage applications.

A fuel cell can include one or more electrochemical fuel cells. For example polymer electrolyte hydrogen fuel cells, direct methanol fuel cells, intermediate temperature fuel cells. Components of a fuel cell include, for example, an anode, anodic catalyst layer, electrolyte, cathodic catalyst layer, cathode, bipolar plates/interconnects and sometimes gaskets for sealing/preventing leakage of gases between anode and cathode.

In one aspect of the present disclosure, a circuit for operating an electrochemical cell can comprise at least one electrochemical cell having a positive terminal and negative terminal for electrically connecting the electrochemical cell to an external load. In other embodiments, the circuit includes a plurality of electrochemical cells electrically connected to each other in parallel or in series. At least one resistor and at least one temperature controlled switch are included in the circuit. The resistor is electrically connected in series to either the positive or negative terminal of the electrochemical cell and the temperature controlled switch is electrically connected to the cell and electrically connected in parallel to the resistor. The temperature controlled switch can have two states. In one state, the switch can direct current through the resistor (High Resistance State). By directing current through the resistor, the amount of current provided by the cell can be reduced. In another state, the switch can direct current to bypass the resistor (Low Resistance State). The circuit can include additional resistors and temperature controlled switches such as a plurality of electrochemical cells, resistors and switches can be arranged to operate in the same manner.

A schematic illustration of an electric circuit for an electrochemical cell according to an embodiment of the present disclosure is shown in FIG. 1. As shown, electric circuit 100 includes electrochemical cell 102 having terminals (104, 106) for electrically connecting the cell to an external load. In this embodiment, resistor 108 is electrically connected to the negative electrode 102*a* of cell 102 in series with terminal 104. Positive electrode 102*b* of cell 102 is electrically connected to terminal 106. Thermally controlled switch 110 is electrically connected in parallel to resistor 108.

Switch 110 can be operated according to the temperature of the cell. When the circuit includes a plurality of cells, the switch can be operated as a function of the temperature of one cell or of the overall cells or of certain cells in a grouping. The temperature of the cell or cells can be approximated by detecting the temperature of the outside of the cell cells or more accurately the temperature can be detected within the cell. When switch 110 is in the open state (High Resistance State or OFF state) electrical current can flow between cell 102 through resistor 108 to terminal 104 to form a high resistance circuit. When switch 110 is in the closed state (Low Resistance State or ON state) electrical current bypasses resistor 108 and flows between cell 102 to terminal 104 to form a low resistance circuit.

When switch 110 is actuated, the resistance at the circuit terminals undergoes a sharp change according to temperature. This design thus modulates the ohmic resistance of the circuit according to temperature. In addition, the heat generated from the resistor can be advantageously used to heat the electrochemical cell using minimal energy from the cell. As such, the circuit design of the present disclosure offers advantages in heating a rechargeable battery that include one or more electrochemical cells and resistor/switch assemblies. Some of these advantages are apparent when comparing the circuit design of the present disclosure to a circuit design that can be derived from certain conventional battery heating circuits.

For example, FIG. 2 illustrates a comparative circuit 200 with limited capabilities for heating a battery. This design includes battery 201 having negative terminal 203 and positive terminal 205 for electrically connecting battery 201 an external load. In this design, resistor 207 is connected in parallel to battery 203 and switch 208 is connected in series with the resistor 207. There are two readily recognizable differences between the design of FIG. 1 of the present disclosure and FIG. 2. In the battery heating circuit in FIG. 2, electric current will flow through the battery whenever the switch is in the closed (ON) state even if the external load is off. In contrast, there is no current through the electrochemical cell in FIG. 1 (present embodiment) in any switch position when the external load is off, i.e. at the open circuit. In addition, the resistance at the circuit terminals for FIG. 1 jumps depending on whether the switch is in the closed (ON) state or open (OFF) state, but the resistance at the circuit terminals does not change in FIG. 2.

In addition to, or as an alternative to using the resistor in the circuit of FIG. 1 for heating the cell, the resistor can be used to improve the safety of the cell. For example, the thermally controlled switch can be activated to direct current through the resistor when the temperature of the cell exceeds a predetermined upper value thereby reducing the current and the rate of cell temperature rise and protecting the cell from thermal runaway. For example, when the battery temperature is above a normal operating temperature such as 50° C., the internal resistance of the battery becomes several-fold higher than when the battery operates in the normal temperature range (e.g. in the range of from about 40 $\Omega cm^2$ to about 200 $\Omega cm^2$).

The circuit of FIG. 1 of the present disclosure can be implemented in a variety of rechargeable battery systems including systems that have rechargeable lithium-ion cells, lithium-polymer cells, lithium-sulfur cells, lithium-air cells, nickel-metal hydride cells, lead-acid cells, intermediate temperature sodium cells, solid state cells. The cells can be electrically connected to each other in a parallel or in a series arrangement or combinations thereof. Such a system can include, for example, a plurality of electrochemical storage cells adjacent each other and electrically connected to each other; a plurality of resistor sheets electrically connected to each other; and at least a first switch electrically connected to the plurality of electrochemical storage cells and electrically connected to the plurality of resistor sheets. Such a switch can form a low resistance circuit by electrically connecting the plurality of electrochemical storage cells in one state (Low Resistance State) and the switch can form a high resistance circuit by electrically connecting the plurality of electrochemical storage cells through the plurality of resistor sheets in another state (High Resistance State). In one aspect of the present disclosure, rechargeable battery systems include the circuit of FIG. 1. The rechargeable battery systems can include the various ways to implement the circuit and additional optional components.

In certain embodiments of the present disclosure, the cells can be electrically connected to each other in a parallel or in a series arrangement or combinations thereof and the resistor sheets can be inside or outside of the cells.

In one aspect of the present disclosure, a resistor sheet is configured to increase the temperature of the electrochemical cell, e.g. the resistor in the circuit of FIG. 1 is a resistor sheet located in close proximity to the cell or inside the cell and in contact with the electrolyte such that when current flows through the resistor sheet it generates heat that can heat the cell. For this embodiment, when the resistor sheets are outside of the cells, they are preferably sandwiched between adjacent cells in the plurality of electrochemical storage cells.

As used herein, a resistor sheet is a material that has a similar or lower electrical conductivity relative to a current-collecting foil of an electrochemical cell but causes a significant increase in the electrical resistance at the circuit terminals when activated by the temperature controlled switch. The resistor sheet preferably has a resistance in units of Ohm equal to the numerical value of between 0.1 to 5 divided by the battery's capacity in Amp-hours (Ah), e.g. between about 0.5 to 2 divided by the battery's capacity in Ah. For example the resistor sheet for a 20 Ah battery is preferably between about 0.005 Ohm (0.1 divided by 20) to about 0.25 Ohm (5 divided by 20), e.g. between about 0.025 Ohm (0.5 divided by 20) to about 0.1 Ohm (2 divided by 20).

The resistor sheets of the present disclosure can be any sufficiently conductive material that is stable when exposed to electrolytes and within the electrochemical voltage window of an electrochemical cell, e.g., a unit cell in a rechargeable battery, when the resistor sheet is exposed to such an environment. Such resistor sheets can be made of, for example, graphite, highly ordered pyrolytic graphite (HOPG), stainless steel, nickel, chrome, nichrome, copper, aluminum, titanium, or combinations thereof. To further protect resistor sheets used inside an electrochemical cell, a thin coating or film, such as Kapton film, may be applied onto resistor sheets, to protect them from contacting the electrolyte. Such a protective coating or film should be sufficiently thin to provide excellent heat transfer between the resistor sheets and their surrounding cell materials.

If used outside of electrochemical storage cells and between two adjacent cells in a module, the resistor sheets do not need to be anti-corrosive nor protective coating is needed; and thus additional materials are available for use as resistor sheets of the present disclosure. In certain embodiments, the resistor sheet of the present disclosure is preferably flat with a large surface area so that it can have good contact with adjacent electrochemical cells. The resistor sheets of the present disclosure can have a thickness between about 1 micrometer and about 150 micrometers with a preferred range of about 5 to about 100 micrometers. Resistor sheets that have large electrical resistance, high thermal conductivity, and small heat capacity are useful for certain embodiments of the present disclosure.

The switch of the present disclosure can include those activated by thermally sensitive devices such as a glycol-water liquid capsule that expands upon freezing and pushes the switch open, a phase-change material that undergoes phase transition and appreciable volume change at different temperatures, or a bimetal switch, or a solid material whose volume expands appreciably at different temperatures, for example. The switch can also be actuated by a controller, an electromechanical relay and a temperature controller, or a solid-state relay with a temperature sensor, a power MOSFET with a temperature sensor, etc. or the switch can include a high-current switch with a temperature sensor. When the switch is actuated, the resistance at the circuit terminals undergoes a sharp change according to temperature. This design thus modulates the ohmic resistance of the circuit according to temperature.

In one embodiment of the present disclosure, the rechargeable battery system includes a plurality of electrochemical storage cells each of which has a positive and negative terminal. The cells can be adjacent each other and electrically connected to each other in a parallel or in a series arrangement or combinations thereof. In this embodiment, the plurality of resistor sheets have a first end and a second end wherein the first end of the plurality of resistor sheets is electrically connected to either a positive or negative terminal of one electrochemical storage cell of the plurality of electrochemical storage cells and the second end of the plurality of resistor sheets is electrically connected to the switch. The switch can form a low resistance circuit by electrically connecting the plurality of electrochemical storage cells in one state (Low Resistance State), or, alternatively, the switch can form a high resistance circuit by electrically connecting the plurality of electrochemical storage cells through the plurality of resistor sheets in another state (High Resistance State). Preferably, the individual resistor sheets in this embodiment can be arranged to be located between adjacent cells, e.g., sandwiched between adjacent cells. Such an arrangement will improve the heating of the cells when the thermally controlled switch directs current to through the resistor sheets.

The temperature of the battery of the present disclosure can be determined or approximated by detecting the temperature of outside of the battery or by detecting the temperature of any one unit cell or a group of unit cells included in the battery. The overall temperature of the battery or any one or group of unit cells is considered the temperature of the battery for purposes of the present disclosure unless stated otherwise. In certain embodiments of the present disclosure, the rechargeable battery system includes one or more temperature sensors for determining a temperature of one or more electrochemical storage cells in the plurality of electrochemical storage cells and the switch forms the Low Resistance State or the High Resistance State based on the temperature determined by the temperature sensor.

Two embodiments of rechargeable batteries having a plurality of electrochemical storage cells and resistor sheets according to the present disclosure are schematically illustrated in FIGS. 3A and 3B. These embodiments illustrate a plurality of cells wherein each cell has only one positive and one negative terminal. FIG. 3A illustrates cells electrically connected in series and FIG. 3B illustrates cells electrically connected in parallel.

For example and as shown in FIG. 3A, rechargeable battery 300A includes unit cells 302a to 302e that are electrically connected in a series arrangement. Each cell has a positive and negative terminal (e.g., 303a and 305a). Resistor sheets 304a to 304d are electrically connected to each other in series and sandwiched between adjacent unit cells. Preferably the resistor sheets are in direct contact with each adjacent unit cell to facilitate heat transfer between the resistor sheet and the adjacent unit cell. As shown in FIG. 3A, the plurality of resistor sheets have a first end which is electrically connected to negative terminal 305a of cell 302a. The plurality of resistor sheets have a second end which is electrically connected to switch 306 and to positive terminal 303b (opposite polarity of 305a) of cell 302b through electrical connector 307. Switch 306 is electrically connected to the plurality of cells by electrical connection to negative terminal 305a of cell 302a. Switch 306 is also electrically connected to the plurality of resistor sheets through an electrical connection to resistor sheet 304a.

In operation, switch 306 is activated by a controller or a thermally sensitive device, for example. In operation, when the battery temperature ($T_{bat}$) is below a predetermined value and when the battery system is in discharge mode, switch 306 is kept in open (High Resistance State) whereby electrical current flows from an external load starting at positive terminal 303a of cell 302a to negative terminal 305a and then through resistor sheets 304a to 304d to positive terminal 303b of cell 302b via electrical connector 307. Current flow continues through cell 302b to negative terminal 305b and then through cells 302c, 302d and 302e to negative terminal 305e to the external load. The heat generated from current flowing through the resistor advantageously heats the electrochemical cell using minimal energy from the cell.

When the battery temperature ($T_{bat}$) is above a predetermined value, switch 306 is closed (Low Resistance State) and electrical current bypasses the resistor sheets. For example when the switch is closed and when the battery system is in discharge mode, electrical current flows among all unit cells 302a to 302e to in a standard way, i.e., current flows from an external load to positive terminal 303a of cell 302a and negative terminal 305e of cell 302e by following an electrical path from the positive terminal 303a and negative terminal 305a of cell 302a and then through positive terminal 303b and negative terminal 305b of cell 302b and then through the positive and negative terminals of cells 302c, 302d and 302e. While the operation of this embodiment is described in a discharge mode, the switch can be operated in the open or closed states during charging or discharging of the cells.

FIG. 3B schematically illustrates the 5-cell module for a rechargeable battery system in which the unit cells are electrically connected in parallel. As shown in the figure, battery 300B includes unit cells 302a to 302e that are electrically connected in a parallel arrangement. Each cell has a positive and negative terminal (e.g., 303a and 305a). Resistor sheets 304a to 304d are electrically connected to each other in series and sandwiched between adjacent unit cells. Preferably the resistor sheets are in direct contact with each adjacent unit cell to facilitate heat transfer between the resistor sheet and the adjacent unit cell. As shown in FIG. 3B, the plurality of resistor sheets have a first end which is electrically connected to negative terminal 305a of cell 302a. The plurality of resistor sheets has a second end which is electrically connected to negative terminal 305e of cell 302e. The plurality of resistor sheets has a second end which is electrically connected to switch 308 via resistor sheet 304d.

In operation, switch 308 is activated by a controller or a thermally sensitive device, for example. In operation, when the battery temperature ($T_{bat}$) is below a predetermined value and when the battery system is in discharge mode, switch 308 can is kept open (High Resistance State). In this way, negative terminals 305a of the cell 302a is electrically connected to negative terminal 305b of the cell 302b via the resistor sheet 304a to 304d and electrical connector 309. The heat generated from current flowing through the resistor advantageously heats the electrochemical cell using minimal energy from the cell.

When the battery temperature ($T_{bat}$) is above a predetermined value, switch 308 is closed (Low Resistance State) and electrical current bypasses the resistor sheets. For example when the switch is closed and when the battery system is in discharge mode, electrical current flows among all unit cells 302a to 302e in a standard way, current flows from an external load to the positive terminals of unit cells 302a to 302e and then the negative terminal and then to the external load. While the operation of this embodiment is described in a discharge mode, the switch can be operated in the open or closed states during charging or discharging of the cells.

Although the battery system exemplified in FIGS. 3A and 3B show one module, the rechargeable battery systems of the present disclosure are not limited thereto and can include a plurality of electrochemical storage cells arranged in modules or subgroups wherein each subgroup of cells has one or more resistor sheets and each subgroup of cells has one or more switches that can direct electrical current through the one or more resistor sheets or that can direct electrical current to bypass the one or more resistor sheets in each subgroup based on the temperature of each subgroup of cells.

In an aspect of the present disclosure, the switch can be, without limitation, a multi-pole, single-throw switch such as a multi-pole, single-throw electrochemical relay with a temperature controller to turn it ON or OFF. Such a switch can be electrically connected to each electrochemical storage cell in the plurality of electrochemical storage cells and can form the Low Resistance State for all of the cells simultaneously or form the High Resistance State for all of the cells simultaneously. For example, FIG. 4 schematically illustrates a multi-pole, single throw relay switch for a five unit cell module of a rechargeable battery. As show in the figure, unit cells (not shown) having cell terminals 402a to 402d are electrically connected to switch 404. Switch is activated by a thermal controller 405 based on a temperature of one or more cells which is determined by a thermocouple 406. Induction coil 407 is used to activate the switch 404. Multiple cells controlled by a multi-pole, single-throw relay 404, as shown in FIG. 4, can be connected in parallel. In this case, a single switch activated ON or OFF simultaneously for all cells connected in parallel is preferred in order to avoid a situation where some cells in a parallel-connected string operate in a low-resistance mode and the other in a high-resistance mode. If the latter happens, there may be a large current imbalance going through various cells connected in parallel. This can be avoided by using a single switch controlling all cells connected in parallel.

The rechargeable battery systems of the present disclosure can be used to power an electric motor. Such a system would include a rechargeable battery having a plurality of electrochemical cells electrically connected to the motor along with additional optional components to operate the system. In one aspect of the present disclosure, the rechargeable battery can be configured using traditional two-terminal battery cells as illustrated in FIGS. 3A and 3B, for example. In another aspect, the rechargeable battery can be configured to have three or more terminals for operating the resistor sheets and switch assembly. The terminals for such a battery include a positive and a negative terminal for operating the battery during a Low Resistance State and at least one high resistance terminal for operating the battery during a High Resistance State. The high resistance terminal would electrically connect one or more resistor sheets in or between cells of the battery and some or all of the cells of the battery, for example.

Figure 5:
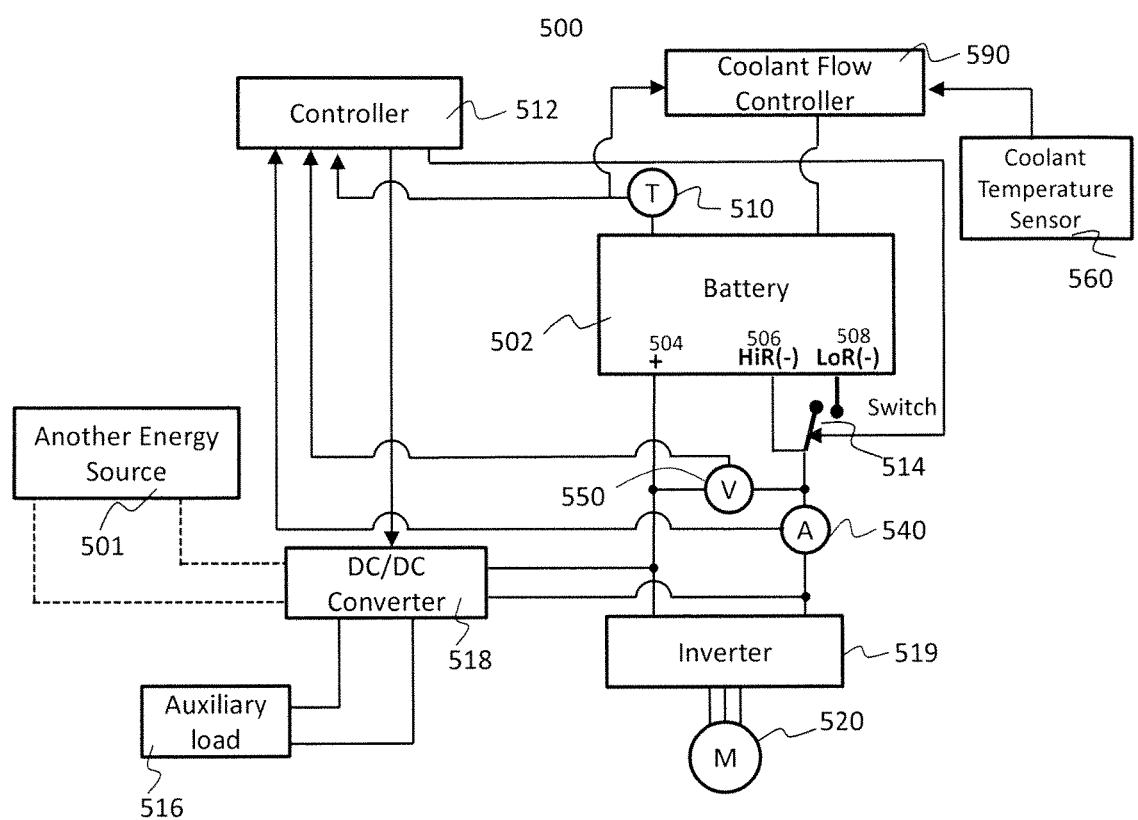
FIG. 5 is a schematic illustration of a battery system design according to an embodiment of the present disclosure which includes a switch that is electrically connected to a high resistance terminal and can be electrically connected or disconnected to a low resistance terminal.

In an embodiment schematically illustrated in FIG. 5, the rechargeable battery system includes rechargeable battery 502 electrically connected to controller 512 through switch 514. The system can also include voltage sensor 550, current sensor 540 and temperature sensor 510 which are all electrically connected to battery 502 and electrically connected to controller 512 and which can all provide inputs to controller 512.

In this embodiment, battery 502 is also electrically connected to motor 520 via inverter 519 and battery 502 is electrically connected to an auxiliary load 516 via DC/DC converter 518. DC-DC converter 518 can adjust the DC terminal voltage of rechargeable battery 520 based on inputs from controller 512. DC/DC converter 518 can also be electrically connected to another energy source 501 as well as to auxiliary load 516. Energy source 501 can be a fuel cell, internal combustion engine, lead acid battery, metal hydride battery, capacitor, another lithium-ion battery, etc.

Rechargeable battery 502 includes one positive terminal 504 and two negative terminals (506, 508). One of the negative terminals is a high resistance terminal (HiR) 506 for operating the battery at a high resistance level and one negative terminal is a low resistance terminal (LoR) 508 for operating the battery at its normal resistance level. Although not shown in the figure for illustrative convenience, rechargeable battery 502 includes a plurality of electrochemical cells that are electrically connected to each other. Rechargeable battery 502 can also include one or more resistor sheets electrically connected to at least one cell and electrically connected to the high resistance terminal of the battery to form the high resistance circuit in the battery.

Current flow to and from the battery to other components of the system is governed by switch 514. For example in this embodiment, the high resistance terminal is always connected to the electrical circuit of the system, while electrical connection of the battery to the system via the Low resistance terminal (LoR) 508 requires switch 514 to be in a closed state. Controller 512 is programmed to determine whether to electrically engage the battery to the system through the low-resistance terminal through the switch based on input from the temperature sensor. For example, if battery temperature ($T_{bat}$) is below a pre-determined value ($T_1$), onboard controller 512 disconnects switch 514 (switch OFF mode) and electricity flows through the high resistance terminal 506 of the battery 502. If battery temperature ($T_{bat}$) is above a pre-determined value ($T_1$), onboard controller 512 connects switch 514 (switch ON mode) and electricity flows through the low resistance terminal 508 of the battery.

When high resistance terminal 506 is in operation (switch 514 OFF mode), electrical energy can be directed to auxiliary load 516. Onboard controller 512 and DC-DC converter 518 can manage the voltage output as per the requirement of the auxiliary load 516. The rechargeable battery system can further include one or more power management devices (not shown) which are programmed to divert some fraction or complete load from the battery between an auxiliary load and main load depending on whether the switch in ON or OFF. Auxiliary load 516 can be, without limitation, for cabin heating, seat heating, a windshield heater etc., or can be a separate energy storage unit where electrical energy is temporarily stored. Once the battery temperature reaches above a second predetermined value ($T_2$), the on-board controller 512 connects switch 514 (switch ON mode) to the low-resistance terminal 508 so the electricity flow is only between the two lower resistance terminals (504, 508) as this is the path of least resistance. Load during this mode of operation is directed to the main load via inverter 519 and an electric motor 520.

Controller 512 can also be programmed to receive inputs from voltage sensor 550 and current sensor 540 and to determine the state of charge (SOC) of battery 502. Controller 512 can also be programmed to determine state of health (SOH) of battery 502 based on standard on-board measurements but not limited to cell capacity and energy. Controller can determine whether battery 502 can be discharged or whether battery 502 needs to be recharged base on the SOC of the battery and can operate switch 514 based on the SOC and the temperature of battery 502.

The rechargeable battery system of FIG. 5 further includes coolant flow controller 590 electrically connected to battery 502 and temperature sensor 510. Coolant flow controller 590 also includes coolant temperature sensor 560 for measuring the temperature of coolant (not shown) that can be used to circulate to battery 502 and a heating or cooling load (not shown). The coolant flow controller, coolant temperature sensor and coolant, e.g., a gas or liquid, can form an active thermal management device to control and maintain a temperature of battery 502.

Figure 6:
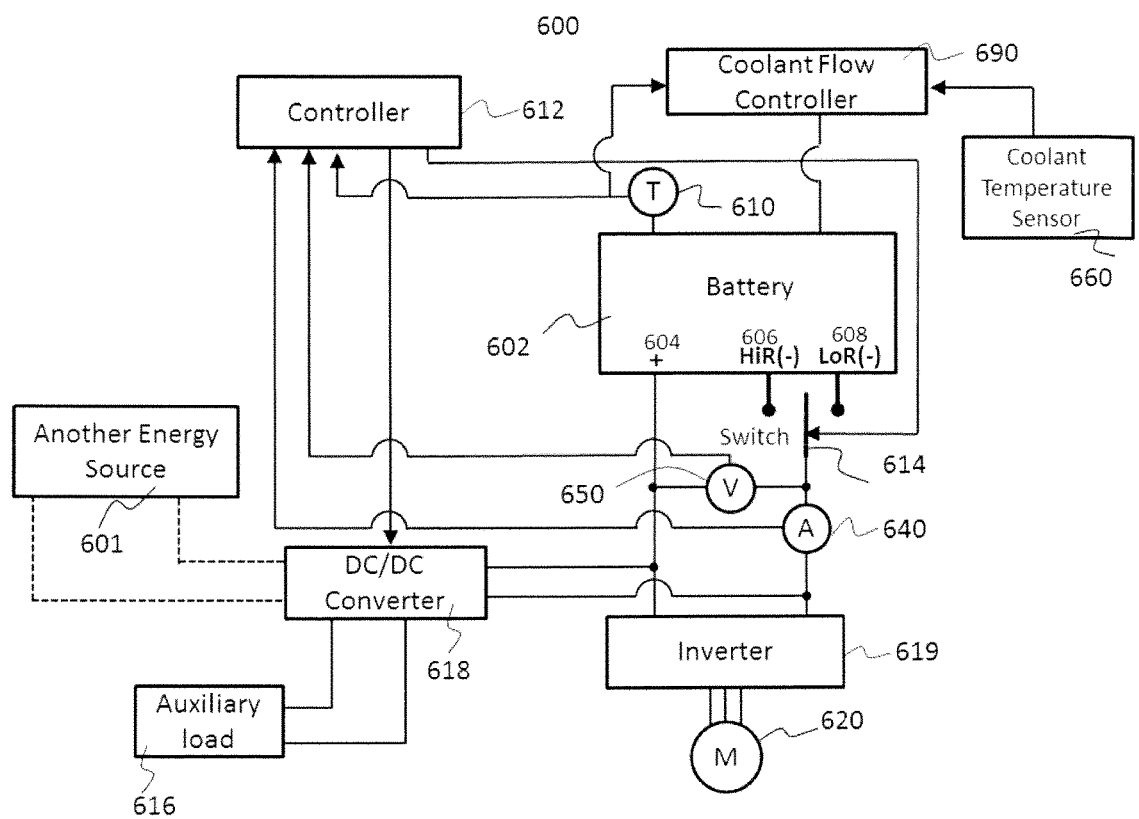
FIG. 6 is a schematic illustration of a battery system design according to an embodiment of the present disclosure which includes a switch that can be electrically connected or disconnected to either a low resistance terminal or a high resistance terminal.

In another embodiment of a battery system of the present disclosure, the switch that electrically connects the rechargeable battery to the system can be a two-contact switch. For example and as shown in FIG. 6, rechargeable battery 602 includes one positive terminal 604 and two negative terminals (606, 608). Switch 614 connects either low resistance negative terminal 608 or high resistance terminal 606 of rechargeable battery 602 to the circuit of system 600. In this embodiment, switch 614 is a two-contact switch and rechargeable battery 602 is not electrically connected to the system unless switch 614 is electrically connected to either the HiR 606 or LoR 608. If battery temperature is below $T_1$, switch 614 connects high resistance terminal 606 to the electrical circuit of system 600 leaving low resistance terminal 608 open. When battery temperature rises above a certain value, switch 614 connects low resistance negative terminal 608 to the electrical circuit of system 600. The other components of system 600 operate and are configured in the same way as similar components described in FIG. 5. For example controller 612, temperature sensor 610, voltage sensor 650, current sensor 640, motor 620, inverter 619, auxiliary load 616, DC-DC converter 618, additional energy source 601, coolant flow controller 690 and coolant temperature sensor 660 are electrically connected, operate and are configured as described for the same components in FIG. 5.

The rechargeable battery of the present embodiment can be configured to operate at a higher resistance level when the internal temperature of the battery is below an optimum temperature. Operating the rechargeable battery of the present disclosure in the High Resistance State or Low Resistance State can depend on a particular predetermined battery temperature as well as the mode of operating the battery (i.e., charge or discharge).

In practice, the rechargeable batteries of the present disclosure can be operated by determining the temperature of the battery ($T_{bat}$) and operating the switch in either the High Resistance State or the Low Resistance State based on $T_{bat}$. The overall temperature of the battery or any one or group of unit cells is considered the temperature of the battery for purposes of the present disclosure unless stated otherwise. In addition, temperature at which the switch is controlled to operate in the High Resistance State or in the Low Resistance State is not necessarily a single fixed value but can be set at different values for different operations of the battery.

Figure 7:
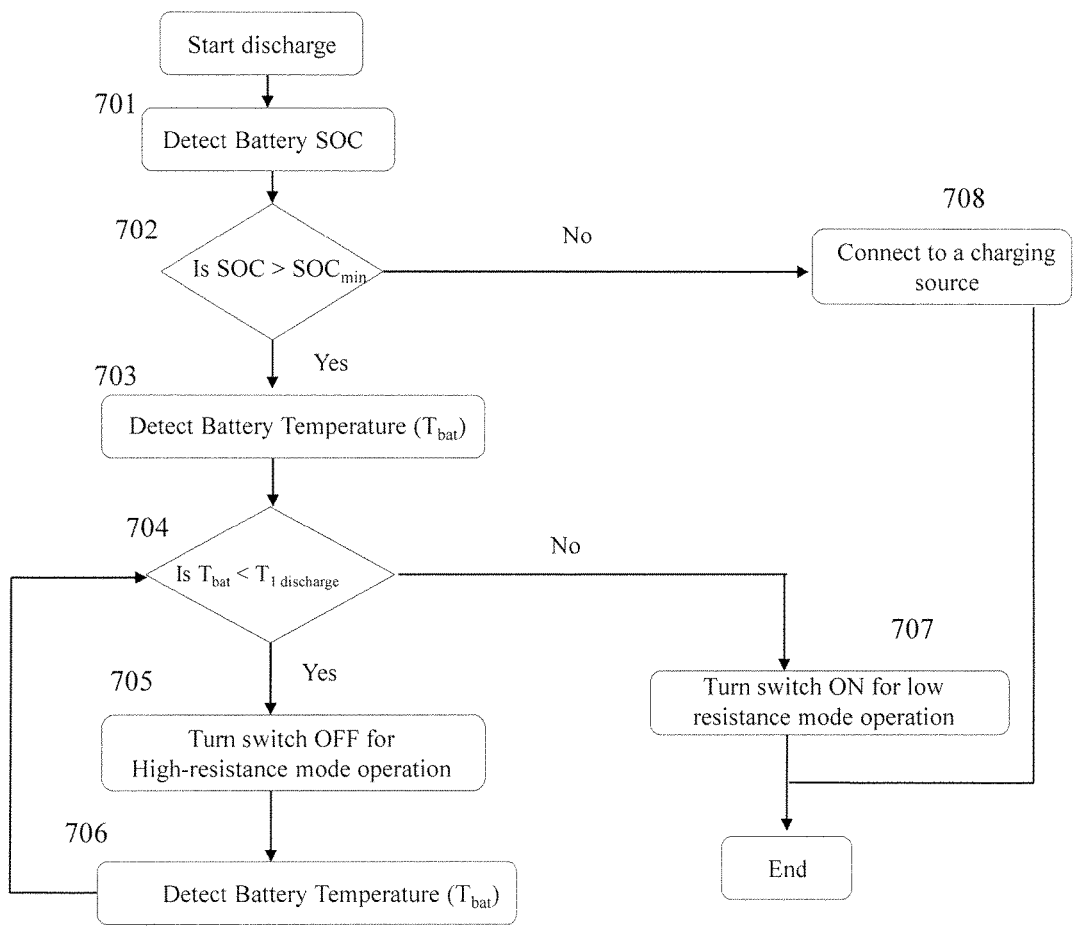
FIG. 7 shows operational algorithm for the battery system of the present disclosure for discharge mode operation.

Next, the operation of a rechargeable battery of the present disclosure during discharge mode is described with the flow chart of FIG. 7. First, the state of charge (SOC) of the rechargeable battery is detected 701 to determine 702 if it is above a minimum value ($SOC_{min}$). If it is not, then an indicator advises to connect to a charging source 708. If SOC is above $SOC_{min}$, the temperature of the battery ($T_{bat}$) is detected 703. A determination is made as to whether $T_{bat}$ is below a predetermined value ($T_{1discharge}$) 704. If a temperature of the battery or if the temperature of a subgroup of cells in the battery, is below $T_{1discharge}$, e.g., $T_{1discharge}$ is about 5° C. or lower, preferably about 0° C. or lower, the switch is set in the High Resistance State (e.g., OFF state) 705. Then, a pre-determined load is drawn from the battery. Electric flow through the high resistance terminal electrically connected to the circuit causes internal heating of the battery. The battery temperature is periodically determined when the switch is OFF 706. When the high resistance terminal is in operation (High Resistance State), the battery terminal voltage is preferably maintained in the range of between about 0.2 and about 1.5 V per cell. As needed, voltage during discharge is managed through a DC-DC converter.

If the battery temperature is determined to be above $T_{1discharge}$, the switch is set in the Low Resistance State (e.g., ON state) 707. Thereby, electricity flows only through the low resistance terminals. The low resistance terminals would be the same as the negative and positive terminals as found on a standard rechargeable battery. The operation of a rechargeable battery according to the flow chart of FIG. 7 can be implemented with the systems of either FIG. 5 or 6, for example, and with the battery configurations of FIG. 3A or 3B, for example. In such systems, the controller is programmed to determine the SOC, $T_{bat}$, the maximum voltage per cell, and whether SOC is above or below $SOC_{min}$, and whether $T_{bat}$ is above or below $T_{1discharge}$ and to operate the switch and DC-DC converter accordingly.

Figure 8:
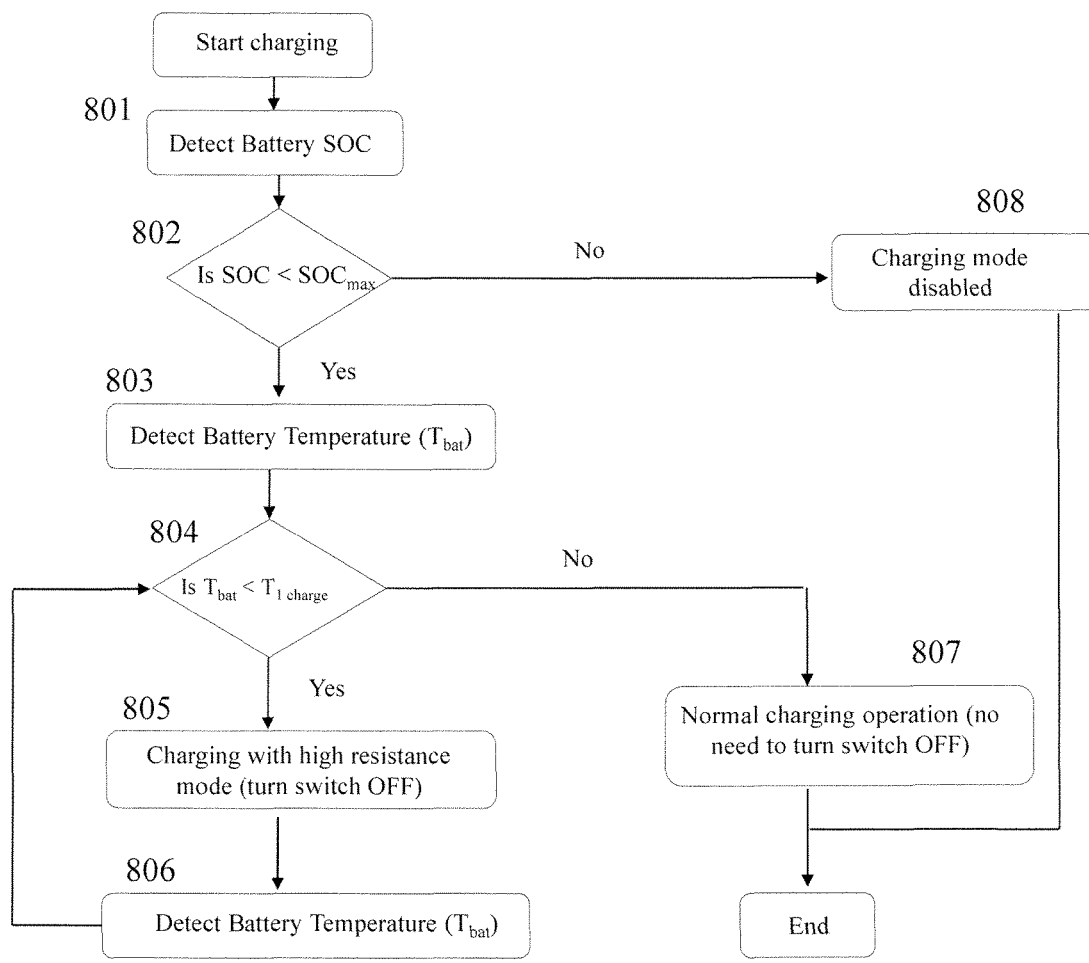
FIG. 8 shows operational algorithm for the battery system of the present disclosure for charge mode operation.

Operation during charging mode of the rechargeable battery system is described with the flow chart of FIG. 8. First, the rechargeable battery SOC is detected 801 and a determination is made 802 if it is below a maximum value $SOC_{max}$. If not, the charging mode is disabled 808. If SOC is below $SOC_{max}$, charging operation will proceed by determining the temperature of the battery ($T_{bat}$) 803. A determination is made as to whether $T_{bat}$ is below a predetermined value ($T_{1charging}$) 804. If $T_{bat}$ is below $T_{1charging}$, e.g., $T_{1charging}$ is about 10° C. or lower, preferably about 5° C. or lower, the switch is set to the High Resistance State (e.g., OFF state) 805. Then, a pre-determined charging load profile is applied from the charger to the battery. When the high resistance terminal is in operation (switch OFF mode), charging is proceeded with maximum voltage per cell in the battery system, e.g., in a range of about 5V-10V, preferably about 5V-8V. The charging load profile during switch OFF mode allows maximum battery terminal voltage to be substantially higher than during switch ON mode. As needed, high voltage during charge with high resistance terminal connected is managed through a DC-DC converter, Electrical flow through the high resistance terminal electrically connected to the circuit causes internal heating of the battery. A fraction of charging power can be diverted to auxiliary power unit if needed.

If battery temperature is determined to be above $T_{1charging}$, the switch is set in the Low Resistance State (e.g., ON state) 807. Thereby, electricity flows only through the low resistance terminals and charging operation continues until battery SOC reaches the desired level. During switch ON mode of charging, maximum voltage per cell in the battery system is kept limited to a value specified by the battery manufacturer, as is the case in standard battery charging operation.

The operation of a rechargeable battery according to the flow chart of FIG. 8 can be implemented with the systems of either FIG. 5 or 6, for example and with the battery configurations of FIG. 3A or 3B, for example. In such systems, the controller is programmed to determine the SOC, $T_{bat}$, the maximum voltage per cell, whether SOC is above or below $SOC_{max}$, $T_{bat}$ is above or below $T_{1charging}$ and to operate the switch and DC-DC converter accordingly.

Figure 9:
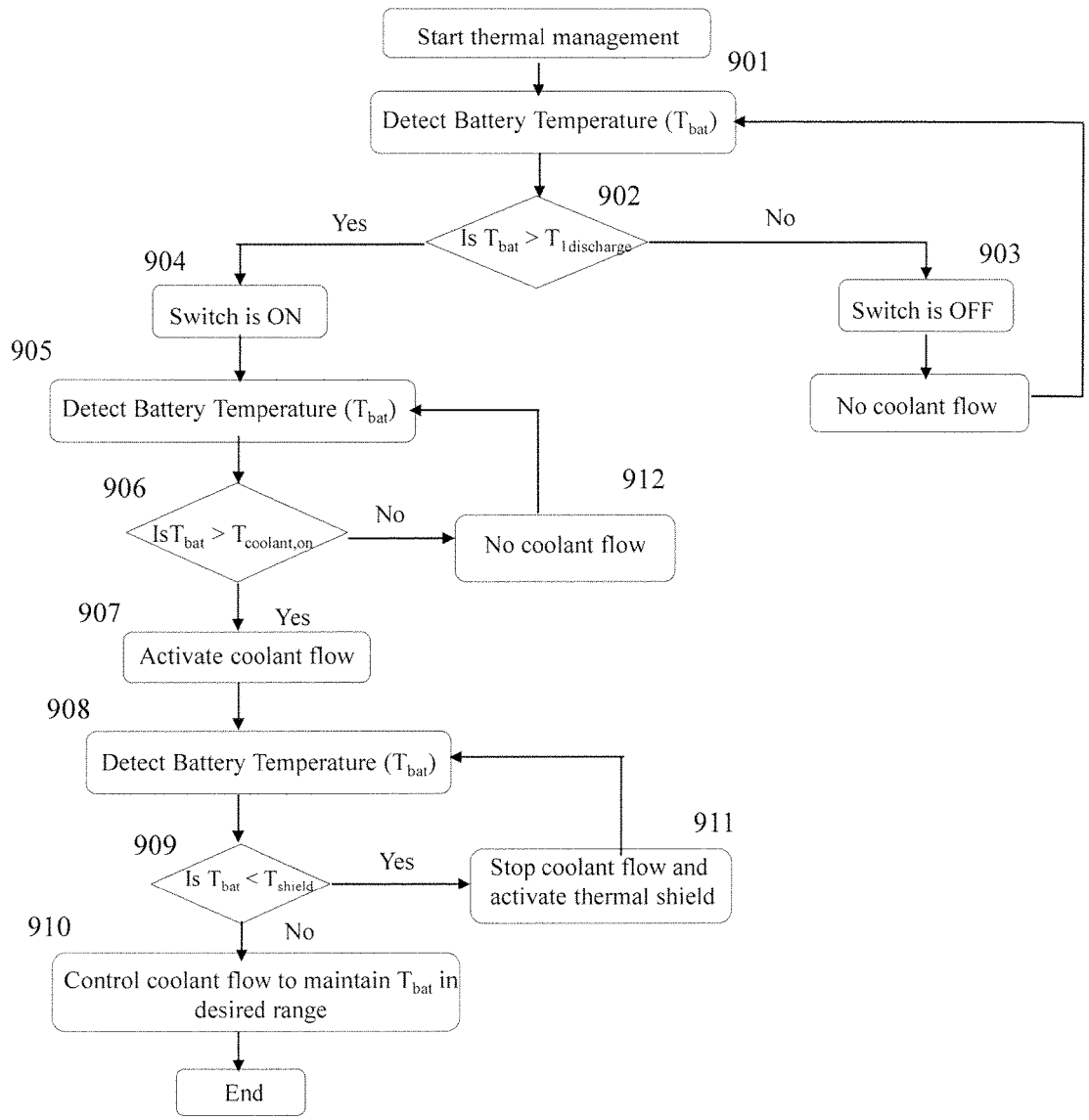
FIG. 9 shows active thermal management algorithm for the battery system of the present disclosure.

The rechargeable battery systems of the present disclosure can also include active thermal management using heat transfer liquid or inert gas to maintain the temperature of the battery within a predetermined operating range. FIG. 9 shows the operation for active thermal management for such a rechargeable battery system.

First, the temperature of the battery ($T_{bat}$) is determined 901. A determination is made as to whether $T_{bat}$ is above a predetermined value 902, e.g., the predetermined value can be the same as $T_{1discharge}$ since this value is typically lower than $T_{1charging}$ but some other values can be used. For this embodiment, the predetermined value will be the same as $T_{1discharge}$. If the temperature of the battery is not above $T_{1discharge}$, the switch that operates the high or low resistance levels of the battery is set in the High Resistance State (e.g., OFF state) 903 and coolant flow is off, i.e. the switch for coolant flow is set to OFF. If the temperature of the battery is above $T_{1discharge}$, the switch that operates the high or low resistance levels of the battery is set in the Low Resistance State (e.g., ON state) 904. The battery temperature is periodically determined when the switch is ON 905. A determination is made as to whether $T_{bat}$ is above a predetermined value for operating the coolant ($T_{coolant}$) 906, e.g., $T_{coolant}$ is a value in a range from about 15° C. to 30° C., preferably from about 25 to 30° C. If $T_{bat}$ is not above $T_{coolant}$, coolant flow will not be activated 912 and $T_{bat}$ will be periodically detected. If $T_{bat}$ is above $T_{coolant}$, coolant flow will be activated 907. The battery temperature is periodically detected when coolant flow is activated 908. With coolant flow on, a determination is made if $T_{bat}$ is below another predetermined value to maintain the temperature of the battery ($T_{shield}$) 909, e.g., $T_{shield}$ is about 10° C. or lower. If $T_{bat}$ is above $T_{shield}$, the flow of the coolant is controlled to maintain the battery temperature in a certain range 910, e.g., maintaining the battery within the range of 20° C. to 35° C., preferably within 25° C. to 30° C.

If battery temperature drops below a certain value ($T_{shield}$), coolant flow is turned OFF and the system will activate a thermal shield around the battery to minimize heat loss from the battery 911. This situation can very well arise if ambient temperature is very low (close to freeing temperature or below) that can incur significant heat dissipation from the battery, especially during low power operation.

Thermal shield activation with the rechargeable battery is designed to avoid the situation where the battery reverts back to where the switch that operates the high or low resistance levels of the battery is set to the High Resistance State after the battery has already been activated (e.g. when battery has already gone through the High Resistance State once when operated in cold temperatures). Thermal shield can include without limitation redirecting coolant flow through a small heater or heat exchanger to pre-heat the coolant itself or applying a pre-heated fluid flow over the battery's surface to form a protecting thin boundary layer. A combination of aforementioned techniques along with reducing or completely shutting down coolant can be utilized for thermal shielding the battery.

The operation of a rechargeable battery according to the flow chart of FIG. 9 can be implemented with the systems of either FIG. 5 or 6, for example and with the battery configurations of FIGS. 3A or 3B, for example. In such systems, the controller is programmed to determine the SOC, $T_{bat}$, and whether SOC is above or below $SOC_{max}$, and $T_{bat}$ is above or below $T_{1discharge}$ and to operate the switch accordingly; and the coolant flow controller is programmed to $T_{bat}$ and whether $T_{bat}$ is above or below $T_{coolant}$ and $T_{shield}$ and to operate coolant flow accordingly.

In another embodiment of operating a rechargeable battery system of the present disclosure, the plurality of electrochemical storage cells can be divided in subgroups and each subgroup of cells can be included in a high or low resistance state at different time, i.e. a cascade activation. For example, the plurality of electrochemical storage cells can be arranged in more than one subgroup of cells (i.e., in a pack or module of cells), wherein each subgroup of cells has one or more resistor sheets and each subgroup of cells has one or more switches that can direct current through the one or more resistors sheets to form a High Resistance State or that can direct current to bypass the one or more resistors sheets to form a Low Resistance State. With this arrangement, a temperature can be determined for each subgroup of cells and the one or more switches in each subgroup of cells can be operated in either in the High Resistance State or the Low Resistance State based on the temperature of the particular subgroup of cells. Operating each subgroup of cells in either the High Resistance State or the Low Resistance State can be done at different times, i.e. a cascade activation, rather than operating all of groups at more or less the same time. Cascade activation of modules can be used in combination with either discharging or charging of the cells For example, if the battery temperature is below a predetermined value, certain switches are set to the High Resistance State for a pre-selected module of cells in the battery. As this module of cells reaches the predetermined temperature, the switch is set to the Low Resistance State and another module of cells undergo the same process. This embodiment, in contrast to the simultaneous switch activation for all cells as described in FIG. 4, delivers higher overall voltage for the plurality of electrochemical cells during the period when the cells are operated with the higher resistance level (e.g., a period in which resistor sheets are active and cells are being internally heated).

Higher battery voltage during the activation period (discharge mode) via cascade activation may be preferred for some applications although such an activation process will experience a longer activation period. For example, during discharge operation mode, when the switch is in the High Resistance State, terminal voltage per cell can be between about 0.2V and about 1.5V so as to quickly heat the battery. During charge operation mode, when switch is the High Resistance State, terminal voltage per cell can go as high as 5V to 10V, for example. Battery voltage can be managed via DC-DC converter before being sent to auxiliary load or main load.

Figure 10:
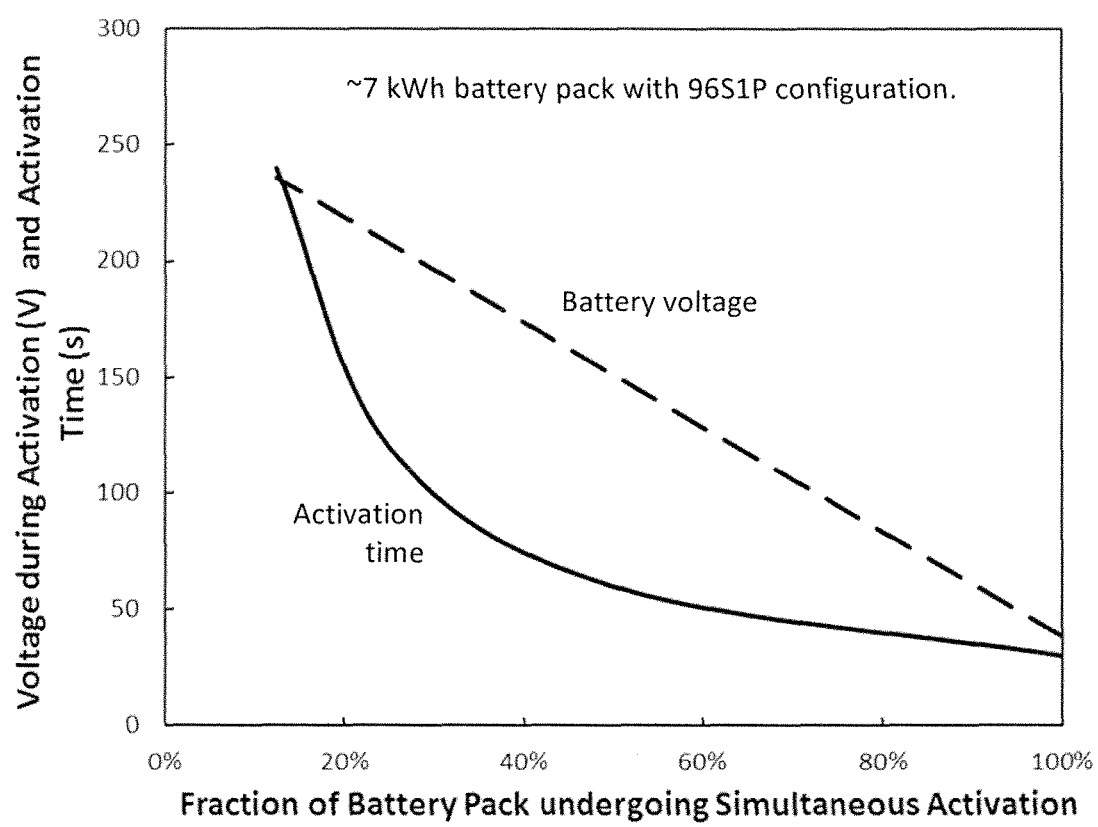
FIG. 10 shows an example of battery voltage during activation period and activation time as a function of cascade activation for the battery system of the present disclosure.

FIG. 10 is a chart showing simulated data for the activation time and pack voltage during activation period as a function of the fraction of battery pack that undergoes activation simultaneously for discharge mode operation of a rechargeable battery system. The battery pack used for FIG. 10 had approximately 7 kWh and included 96 cells in series that were divided into 8 batches with each cell having 20 Ah capacity. Ambient temperature is −25° C. and battery activation is done until battery (or module) temperature reached 5° C. A 60 A discharge current is used for the activation period. On the axis of FIG. 10 for the fraction of battery pack undergoing simultaneous activation, a value of 100% represents simultaneous activation of all the cells in the pack whereas a value of 12.5% represents activation of 1 module (out of 8 modules) at a time before the activation is cascaded to the other 7 modules.

As shown in FIG. 10, simultaneous activation for the battery pack can be achieved in 30 sec but the battery pack voltage during this activation period is less than 40V. For automotive application, this range of output voltage can be used to support auxiliary load. However, significantly higher battery output voltage during activation can be achieved at the expense of longer activation time when cascade activation is utilized. Based on application demand, activation procedure can be chosen that can enable maximum usage of battery output voltage during activation period with minimal activation period.

The battery systems of the present disclosure advantageously do not require an external heating system and therefore substantially simplify thermal management of the system. This allows reduction in system size, complexity and cost and can be implemented in a variety of situations and systems. For instance, an electric vehicle with the battery system of the present disclosure can readily deliver greater than about 80% electric range even if left unplugged in an open parking space under cold temperatures using the operation algorithms described in FIGS. 7-9.

The battery systems of the present disclosure can significantly reduce heating time as compared with other systems, e.g. convective heating, direct discharge of the pack, while minimizing the amount of battery energy expended for heating the battery. The battery systems of the present disclosure can advantageously heat a rechargeable battery at below an optimum temperature, e.g., exposed to cold temperatures such as below about 0° C. or less. The system can rapidly heat the battery with minimal loss of useable battery capacity or energy. Further, the battery systems of the present disclosure have substantial benefits such that they do not require additional moving parts, involvement of fluids or circulation loops, minimal additional weight/volume requirements, no additional storage circuit for storing energy, etc. to operate effectively. While these additional elements are not needed to internally heat the rechargeable batteries of the present disclosure, they can be included in system.

The above-described embodiments of the battery system and its operation methods are to illustrate the disclosure and are not limiting in nature. Those skilled in the art will recognize, or be able to ascertain, using no more than routine experimentation, numerous equivalents to the specific substances and procedures described in this section.

What is claimed is:

1. A circuit for operating an electrochemical cell comprising:
    at least one electrochemical cell having a positive terminal and negative terminal for electrically connecting the electrochemical cell to an external load;
    a resistor electrically connected in series to either the positive or negative terminal of the electrochemical cell, wherein the resistor is in contact with or is within the at least one electrochemical cell such that when current flows through the resistor it generates heat that heats the at least one electrochemical cell; and
    a temperature controlled switch electrically connected to the cell and electrically connected in parallel to the resistor, wherein the switch directs current through the resistor (High Resistance State) when a temperature of the electrochemical cell is below a predetermined value or directs current to bypass the resistor (Low Resistance State) when a temperature of the at least one electrochemical cell is above a predetermined value.

2. The circuit according to claim 1, wherein the electrochemical cell is a rechargeable lithium ion battery unit cell.

3. A rechargeable battery system comprising:
a plurality of electrochemical storage cells adjacent each other and electrically connected to each other;
a plurality of resistor sheets electrically connected to each other, wherein each of the plurality of resistor sheets is sandwiched between and in contact with adjacent cells in the plurality of electrochemical storage cells and/or inside one or more cells of the plurality of electrochemical storage cells; and
at least a first switch electrically connected to the plurality of electrochemical storage cells and electrically connected to the plurality of resistor sheets;
wherein the switch forms a low resistance circuit by electrically connecting the plurality of electrochemical storage cells in one state (Low Resistance State) when a temperature of at least one of the plurality of electrochemical storage cells is above a predetermined value; or the switch forms a high resistance circuit by electrically connecting the plurality of electrochemical storage cells through the plurality of resistor sheets in another state (High Resistance State) when a temperature of at least one of the plurality of electrochemical storage cells is below a predetermined value to heat the plurality of electrochemical storage cells.

4. The rechargeable battery system according to claim 3, wherein the plurality of electrochemical storage cells each have a positive and negative terminal and the plurality of resistor sheets are electrically connected in series and have a first end and a second end wherein the first end of the plurality of resistor sheets is electrically connected to either a positive or negative terminal of one electrochemical storage cell of the plurality of electrochemical storage cells and the second end of the plurality of resistor sheets is electrically connected to the switch.

5. The rechargeable battery system according to claim 4, wherein the plurality of electrochemical storage cells are electrically connected to each other in series and the second end of the plurality of resistor sheets is further electrically connected to another terminal of another electrochemical storage cell of the plurality of electrochemical storage cells.

6. The rechargeable battery system according to claim 4, wherein each of the plurality of resistor sheets is inside one or more cells of the plurality of electrochemical storage cells.

7. The rechargeable battery system according to claim 3, wherein the plurality of electrochemical storage cells are lithium ion electrochemical storage cells.

8. The rechargeable battery system according to claim 3, further comprising one or more temperature sensors for determining a temperature of one or more electrochemical storage cells in the plurality of electrochemical storage cells and wherein the switch forms the Low Resistance State or the High Resistance State based on the temperature determined by the temperature sensor.

9. The rechargeable battery system according to claim 3, further comprising a controller electrically connected to the switch and programmed to operate the switch in the High Resistance State or Low Resistance State based on a temperature of at least one electrochemical storage cell.

10. The rechargeable battery system according claim 9, wherein the controller is programmed to operate the switch in the High Resistance State when a temperature of at least one electrochemical storage cell is 10° C. or lower during charge of the plurality of electrochemical storage cells.

11. The rechargeable battery system according to claim 3, further comprising an electric motor electrically connected to the plurality of electrochemical storage cells via the switch.

12. The rechargeable battery system according to claim 11, further comprising an inverter to convert DC power from the plurality of electrochemical storage cells into AC power for the electric motor.

13. The rechargeable battery system according to claim 3, wherein the plurality of resistor sheets comprise graphite, highly ordered pyrolytic graphite (HOPG), stainless steel, nickel, chrome, nichrome, copper, aluminum, titanium, or combinations thereof.

14. The rechargeable battery system according to claim 3, wherein each of the plurality of resistor sheets is inside one or more cells of the plurality of electrochemical storage cells.

15. A method of operating a rechargeable battery system having a plurality of electrochemical storage cells adjacent each other and electrically connected to each other; a plurality of resistor sheets electrically connected to each other, wherein each of the plurality of resistor sheets is sandwiched between and in contact with adjacent cells in the plurality of electrochemical storage cells and/or inside one or more cells of the plurality of electrochemical storage cells; and at least a first switch electrically connected to the plurality of electrochemical storage cells and electrically connected to the plurality of resistor sheets; wherein the switch forms a low resistance circuit by electrically connecting the plurality of electrochemical storage cells in one state (Low Resistance State); or the switch forms a high resistance circuit by electrically connecting the plurality of electrochemical storage cells through the plurality of resistor sheets in another state (High Resistance State) to heat the plurality of electrochemical storage cells, the method comprising:
determining a temperature of at least one electrochemical storage cell ($T_{bat}$); and
operating the switch in either the High Resistance State or the Low Resistance State based on $T_{bat}$.

16. The method of claim 15, further comprising operating the switch in the High Resistance State if $T_{bat}$ is 5° C. or lower during discharge of the plurality of electrochemical storage cells.

17. The method of claim 15, further comprising operating the switch in the High Resistance State if $T_{bat}$ is 10° C. or lower during charge of the plurality of electrochemical storage cells.

18. The method of claim 15, wherein the plurality of electrochemical storage cells are arranged in more than one subgroup of cells, wherein each subgroup of cells has one or more resistor sheets and each subgroup of cells has one or more switches that can direct current through the one or more resistors sheets to form a High Resistance State or that can direct current to bypass the one or more resistors sheets to form a Low Resistance State, and wherein the method further comprises determining a temperature of each subgroup of cells and operating the one or more switches in each subgroup of cells in either in the High Resistance State or the Low Resistance State based on the temperature of each subgroup of cells.

19. The method of claim 18, further comprising operating each subgroup of cells in either the High Resistance State or the Low Resistance State by cascade activation.

20. The method of claim 19, further comprising charging or discharging the plurality of electrochemical cells by cascade activation.

* * * * *